(12) United States Patent
Campbell et al.

(10) Patent No.: US 8,051,897 B2
(45) Date of Patent: Nov. 8, 2011

(54) REDUNDANT ASSEMBLY FOR A LIQUID AND AIR COOLED MODULE

(75) Inventors: Levi A. Campbell, New Paltz, NY (US); Richard C. Chu, Hopewell Junction, NY (US); Michael J. Ellsworth, Jr., Lagrangeville, NY (US); Madhusudan K. Iyengar, Kingston, NY (US); Roger R. Schmidt, Poughkeepsie, NY (US); Robert E. Simons, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 801 days.

(21) Appl. No.: 11/290,899

(22) Filed: Nov. 30, 2005

(65) Prior Publication Data

US 2007/0119569 A1 May 31, 2007

(51) Int. Cl.
*F28F 7/00* (2006.01)
*H05K 7/20* (2006.01)
*H05K 5/00* (2006.01)

(52) U.S. Cl. .................. 165/80.4; 361/699; 454/184
(58) Field of Classification Search .............. 361/699; 165/80.4; 454/184
See application file for complete search history.

(56) References Cited

U.S. PATENT DOCUMENTS

| | | | |
|---|---|---|---|
| 4,698,728 A | 10/1987 | Tustaniwskyj et al. | |
| 5,285,347 A | 2/1994 | Fox et al. | |
| 5,323,847 A * | 6/1994 | Koizumi et al. | 165/104.33 |
| 5,552,960 A * | 9/1996 | Nelson et al. | 361/687 |
| 5,706,668 A * | 1/1998 | Hilpert | 62/259.2 |
| 5,731,954 A | 3/1998 | Cheon | |
| 5,898,568 A | 4/1999 | Cheng | |
| 6,094,347 A | 7/2000 | Bhatia | |
| 6,161,612 A * | 12/2000 | Stahl et al. | 165/80.4 |
| 6,166,907 A * | 12/2000 | Chien | 361/699 |
| 6,275,945 B1 | 8/2001 | Tsuji et al. | |
| 6,276,448 B1 | 8/2001 | Maruno | |
| 6,353,536 B1 | 3/2002 | Nakamura et al. | |
| 6,459,575 B1 | 10/2002 | Esterberg | |

(Continued)

OTHER PUBLICATIONS

Office Action for U.S. Appl. No. 11/290,898 (U.S. Patent Publication No. 2007/00121295 A1), dated Feb. 7, 2008.

(Continued)

*Primary Examiner* — Cheryl J Tyler
*Assistant Examiner* — Brandon M Rosati
(74) *Attorney, Agent, or Firm* — Dennis W. Jung, Esq.; Kevin P. Radigan, Esq.; Heslin Rothenberg Farley & Mesiti P.C.

(57) ABSTRACT

A redundant assembly for an air and liquid cooled module is provided. The redundant cooling assembly comprises an air and liquid cooled module having a cold plate in thermal communication with a side attached auxiliary drawer. The auxiliary drawer houses a heat exchanger, a liquid pump with piping such that the heat exchanger, the liquid pump with piping and the cold plate form a closed liquid cooling loop. The auxillary drawer also housing an air moving device such that air can readily pass through the air moving device and the heat exchanger in order to provide air cooling. In one embodiment of the invention, fins are disposed on the cold plate to provide cooling in case the pump or the air moving device or both encounter a failure. In alternate embodiments, multiple pumps and/or multiple air moving devices can be used with or without the cold plate fins to provide redundancies.

10 Claims, 2 Drawing Sheets

U.S. PATENT DOCUMENTS

| | | |
|---|---|---|
| 6,606,254 B2 | 8/2003 | Yoneda |
| 6,687,123 B2 * | 2/2004 | Kitahara ................. 361/695 |
| 6,826,047 B1 | 11/2004 | Chen et al. |
| 6,966,358 B2 | 11/2005 | Rapaich |
| 6,980,435 B2 * | 12/2005 | Shum et al. ............. 361/695 |
| 7,019,968 B2 | 3/2006 | Kitahara |
| 7,068,509 B2 * | 6/2006 | Bash et al. ............... 361/700 |
| 7,149,084 B2 * | 12/2006 | Matsushima et al. ..... 361/699 |
| 7,203,063 B2 * | 4/2007 | Bash et al. ............... 361/699 |
| 7,273,088 B2 | 9/2007 | Malone et al. |
| 7,660,116 B2 * | 2/2010 | Claassen et al. ......... 361/696 |
| 2002/0015287 A1 | 2/2002 | Shao |
| 2002/0105783 A1 | 8/2002 | Kitahara |
| 2004/0008483 A1 | 1/2004 | Cheon |
| 2005/0068728 A1 | 3/2005 | Chu et al. |
| 2005/0162831 A1 * | 7/2005 | Shum et al. .............. 361/695 |
| 2006/0037739 A1 | 2/2006 | Utsunomiya |
| 2006/0082966 A1 | 4/2006 | Lev et al. |
| 2007/0121295 A1 | 5/2007 | Campbell et al. |

OTHER PUBLICATIONS

Office Action for U.S. Appl. No. 11/290,898 (U.S. Patent Publication No. 2007/00121295 A1), dated Jul. 11, 2008.

Office Action for U.S. Appl. No. 11/290,898 (U.S. Patent Publication No. 2007/00121295 A1), dated Sep. 19, 2008.

* cited by examiner

REDUNDANT ASSEMBLY FOR A LIQUID AND AIR COOLED MODULE

CROSS-REFERENCE TO RELATED APPLICATIONS

This application contains subject matter which is related to the subject matter of the following application, filed on the same day, which is assigned to the same assignee as this application, International Business Machines Corporation of Armonk, N.Y. The application listed below is hereby incorporated herein by reference in its entirety: U.S. Ser. No. 11/290,898, entitled "Hybrid Liquid-Air Cooled Module" filed on the same day as this application, and which was published on May 31, 2007, as U.S. Patent Publication No. 2007/0012195 A1.

BACKGROUND OF THE INVENTION

1. Field of the Invention

This invention relates to cooling of electronic packages used in-computing system environments and more particularly to cooling of electronic components and packages used in mid-range and high-end high volume servers.

2. Description of Background

The industry trend of continuously increasing the number of electronic components inside computing system environments, has led to many challenges in the design and implementation of these systems. In simple computing system environments such as those comprising one or more personal computers, the challenges are easier to meet. In larger system environments, however, that include many computers in processing communication with one another, design challenges are harder to resolve.

One such important design challenge is management of dissipated heat generated by the computer system. Heat dissipation if unresolved, can result in electronic and mechanical failures that will affect overall system performance, no matter what the size of the environment. As can be easily understood, the heat dissipation increases as the packaging density increases. In larger computing system environments, not only are heat generating electronic components more numerous, but thermal management solutions that need to be implemented must be provided in view of other needs of the system environment. Improper heat dissipation can create a variety of other seemingly unrelated problems. For example solutions that involve inclusion of heavy fans, blowers and other such components may lead to weight issues that can affect the structural rigidity of the computing system environment. In customer sites that house complex or numerous computing system environments, unresolved heat dissipation issues may necessitate other cost prohibitive solutions such as supplying additional air conditioning to the customer site.

Heat dissipation issues have become a particular challenge in mid range and high volume computing system environments and prior art has made some attempts to resolve this issue. The problem with such arrangement is that the technology currently being practiced is reaching the end of its extendability, especially in regard to the newer microprocessor technology that uses metal oxide semiconductor (CMOS) packages. In recent years, current prior art arrangements are having difficulties resolving heat load and local heat flux issues and these have become a critical factor, especially in the design of mid to high-range, high volume server packages.

Co-pending application POU920050148, introduces a concept where a hybrid liquid and air cooled module is employed. Through the use of its dual air and liquid cooled systems, system performance is greatly enhanced using cost effective, easy to implement methodology. The co-pending application, however, does not provide for a redundant system. In large system environments that incorporate many electronic components, a number of factors can cause one or more cooling elements in any cooling module to fail. Therefore providing a redundant system is desirous in case one or a plurality of these elements shall experience such failure.

Consequently, a new and improved cooling arrangement is desired that can provide the concepts provided in the co-pending application but with some built-in redundancies in case of systemic failures. This would be especially useful in larger environments that incorporate next generation CMOS technology in mid to high range, high volume servers.

SUMMARY OF THE INVENTION

The shortcomings of the prior art are overcome and additional advantages are provided through the provision of a redundant assembly for an air and liquid cooled module. The redundant cooling assembly comprises an air and liquid cooled module having a cold plate in thermal communication with a side attached auxiliary drawer. The auxiliary drawer also houses a heat exchanger and an air moving device such that air can move through easily, to provide for air cooling. In addition, the auxiliary drawer houses a liquid pump with piping such that the liquid pump with piping, the heat exchanger and the cold plate form a closed liquid cooling loop.

In one embodiment of the invention, fins are disposed on the cold plate to provide air cooling in case the pump or the air moving device or both encounter a failure. In an alternate embodiment, at least two liquid pumps are provided with or without the use of fins. The pumps can be connected either in parallel or serially to provide continuous flow and unit operation during a failure. In another embodiment, instead of the fins and the pumps at least two air moving devices are provided. The air moving devices can be fans or blowers. In different embodiments, the multiple air moving devices can be incorporated with other redundancies such as the cold plate fins and multiple pumps as discussed.

Additional features and advantages are realized through the techniques of the present invention. Other embodiments and aspects of the invention are described in detail herein and are considered a part of the claimed invention. For a better understanding of the invention with advantages and features, refer to the description and to the drawings.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

DESCRIPTION OF THE INVENTION

Figure 1:
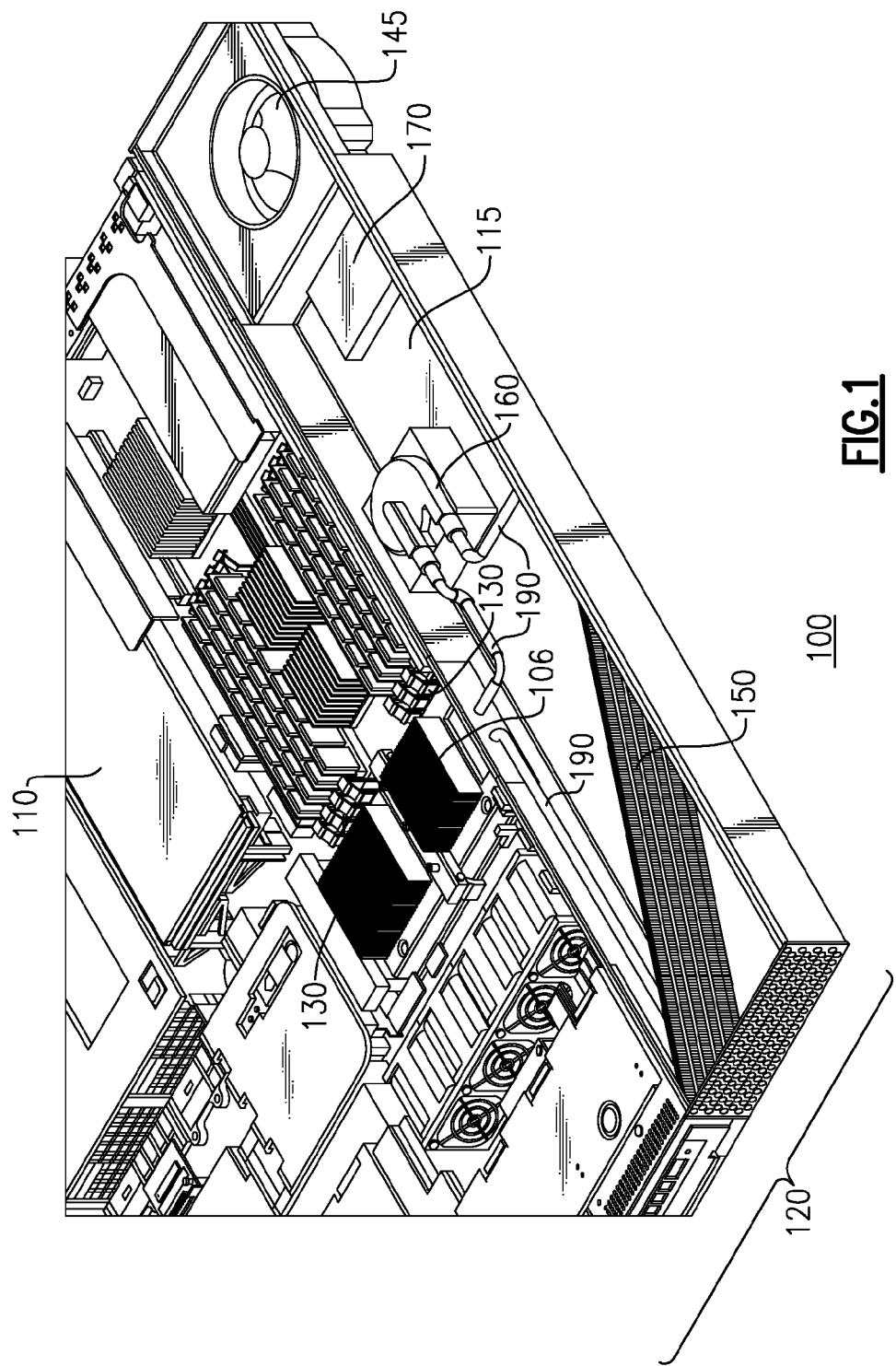
FIG. 1 is a illustration of one embodiment of the present invention implementing an secondary air cooled redundancy feature.

FIG. 1 is an isometric illustration of a redundant cooling assembly 100 that cools electronic components as provided on a main drawer 110. Module 120 is a hybrid air and liquid cooled module comprises a cold plate 130 and an auxiliary drawer 115, which is preferably side attached to the main drawer 110 and the cold plate 130. The auxiliary drawer further contains an air moving device 145, a heat exchanger 150, a liquid pump 160, and in some embodiments a control card 170 and piping 190.

The air cooled portion comprises of an air moving device such as a blower 145, one or more cold plate(s) 130 and the heat exchanger 150. In one embodiment, air is taken from the room by the blower 145 and pushed through the auxiliary tray or drawer 115 to remove heat from the heat exchanger 150. The pump 160 circulates liquid from the heat exchanger 150 to the cold plate 130. The heat exchanger 150 can be placed substantially horizontally, at an oblique angle, or even on an intersecting plane as illustrated in reference to the horizontal plane of the auxiliary drawer 115 to further facilitate airflow. For example, depending on the angle of placement, the air flow is either directed in an upward or downward flow upon entering the heat exchanger 150.

The liquid cooled portion of the module 120 includes the cold plate(s) 130 which is thermally connected to the pump 160 and the heat exchanger 150, which when thermally connected forms a closed loop liquid cooling assembly. The thermal connection between the pump 160, heat exchanger 150 and the cold plate 130, can be achieved through a number of means known to those skilled in the art such as through piping 190 as illustrated.

Cooling liquid is pumped from the cold plate(s) 130 through the pump 160 through piping 190. This liquid is then circulated to the heat exchanger 150 through piping 190. Liquid flowing through the pipes and internal to the heat exchanger rejects heat to the air provided by the blower. The cooled liquid is then returned to the cold plate to extract heat from electronic devices, thus establishing a closed liquid cooling loop.

Referring back to FIG. 1, fins 106 are provided as part of the cold plate(s) 130 to establish a redundant assembly. In the illustrated embodiment, the fins 106 are air cooled and are provided on the backside of the cold plate(s) 130. The fins 106 increase active heat transfer area during normal operation of the module 120. The main advantage of the fins 106, however, are to provide backup cooling in case of a failure of the air moving device 145, the pump 160 or both simultaneously. The redundancy provided can also apply to heat exchanger or cold plate plugging failure. In all such cases, the computing system environments, and any servers or other computers that are included and thus directly affected, may continue operation in a degraded mode. In addition, the redundant feature as provided also increases the available air-side heat transfer area during normal operation which leads to an enhanced performance. One reason for this is that in case of a failure, the fans in the computing environment (i.e. server) are supplying the air flow and removing the heat from the electronic components.

It should also be noted that the hybrid module 120 can operate in the air-liquid cooled hybrid mode, or in single air cooled or single liquid cooled mode selectively as desired and the addition of fins 106 can help improve performance and thermal management when the module 120 is selectively run in single mode as well.

The embodiment of FIG. 1 illustrates a particular arrangement of the heat exchanger 150 and cold plate(s) 130. The workings of the present invention, however, shall not be limited to any restrictions provided in the figure as to enhance ease of understanding. As discussed before, other heat exchanger arrangements can be made with one or a plurality of cold plates 130 with less or additional fins, in alternate embodiments.

As discussed, it would be advantageous for a thermal management performance to have a hybrid system, however, the single liquid or air cooled sidekick design is also advantageous in its own right and can still provide thermal and other advantages as has been discussed.

The present invention, as discussed above provides for an improved cooling module that resolves the problems of prior art currently being practiced. The hybrid air and liquid cooled scheme achieves maximum performance results and introduces a cooling technology with greater heat dissipation capability that will not disturb other electronics in these computing system environments. The hybrid module of the present invention introduces superior cooling, especially to one or a plurality of microprocessors utilized in a larger computing system environment. This will allow the utilization of higher voltages and frequencies in these microprocessors, which in turn enables high-performance packages to be offered with minimal impact to customers and vendors. In addition, the present invention allows for a manner to extend a 19 inch drawer, when desired, to one that can be utilized with a 24 inch rack, a factor that will provide advantages to users of larger computing system environments.

Figure 2:
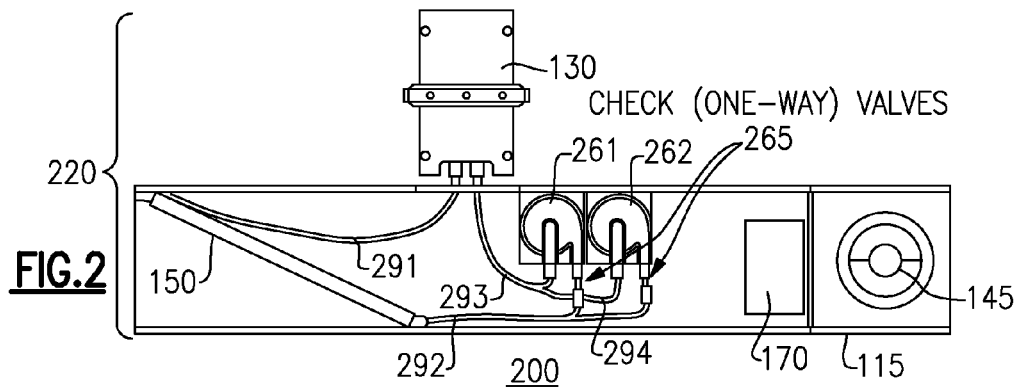
FIG. 2 is an illustration of an alternate embodiment having a redundant feature that utilizes a plurality of parallel pumps.

FIG. 2 provides an alternative embodiment of the present invention having a redundant cooling assembly 200. The redundant assembly is to be incorporated in the hybrid module 120 of FIG. 1. In this manner the cross sectional illustration of FIG. 2 still provides for cold plate 130 which is in thermal communication with the auxiliary drawer 115. As before, the auxiliary drawer 115 contains the air moving device 145, heat exchanger 150 and control card 170. Piping 190 is also provided.

In addition, a plurality of liquid cooled pumps are provided that are referenced as 261 and 262. It should be noted that while only two pumps 261 and 262 are illustrated in the figure for ease of understanding and viewing, alternate embodiments having more than two pumps can also be implemented.

The dual pumps 261 and 262 as provided in FIG. 2 are provided such that fluid flow is piped in parallel with respect to the pumps. The parallel arrangement of the pipes are illustrated by sectional pipe connections 291 through 294. In addition check valves 265 are also provided as illustrated. Check valves 265 are preferably one way valves.

In one embodiment, check valves 265 are fitted one each to the discharge sides of the pumps, thereby allowing that if one of the pumps fails, the unit can still function normally. It is possible in some instances for the pumps to both operate below maximum capacity during normal operation. In this case if one pump fails, then the second (or other) pump(s) would increase its speed to compensate.

In another scenario, only one pump would be operating at any given time and in the event of failure the second pump will completely take over the operation. In some embodiments, it is possible to utilize more than two pumps and a variety of such scenarios or their combination may also occur during operation, and in each case having additional pipes will provide for a continuous and enhanced operation.

It should also be noted that additional fin addition of the embodiment of FIG. 1 can also be incorporated into the embodiment of FIG. 2 to provide dual redundancies.

Figure 3:
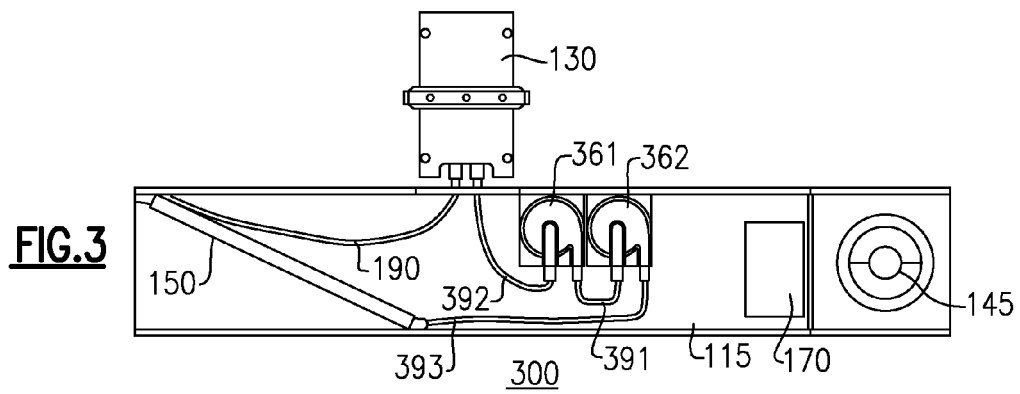
FIG. 3 is an illustration of yet another embodiment providing a serial fluid flow redundant system.

In certain instances, it may be desirous to have an embodiment where the pumps are piped such that the fluid flow is serial with respect to the pumps as opposed to the previous case as illustrated in FIG. 2. FIG. 3 is a cross sectional illustration of such an embodiment.

In the cross sectional illustration of FIG. 3, two pumps 361 and 362 are provided. Again as was the case in FIG. 2, only two pumps are shown for ease of understanding while other embodiments with more numerous pumps can also be implemented.

As before the cross sectional illustration of FIG. 3 depicts different parts of the module 120, such as cold plate 130 and auxiliary drawer 115 over which the pumps 361 and 362 are disposed. As indicated before, in this scenario the pumps are piped such that the fluid flows in a serial manner as depicted by piping sections 391 specifically as well as 392 and 393. The one way check valves of the previous embodiment is not present in this embodiment as depicted.

In this scenario, both pumps operate at below maximum capacity during normal operation. In the event of a pump failure, the remaining pump would increase its speed to continue the unit's operation. As before this embodiment can be also combined with other embodiments discussed to achieve improved performance when desire.

In many large computing environments, electronic components are disposed over drawers, such as the main drawer 110 as illustrated in FIG. 1. These drawers are then disposed over one another in a rack to form a server package as stated earlier. In FIG. 1, a traditional main drawer similar to the one illustrated would be a 19 inch drawer to be used in a typical 1U or 2U arrangements. Larger computing systems such as those employing servers, however employ larger 24 inch racks. The addition of the auxiliary drawer allows the flexibility of using the present invention in 1U or 2U server package arrangement.

Figure 4:
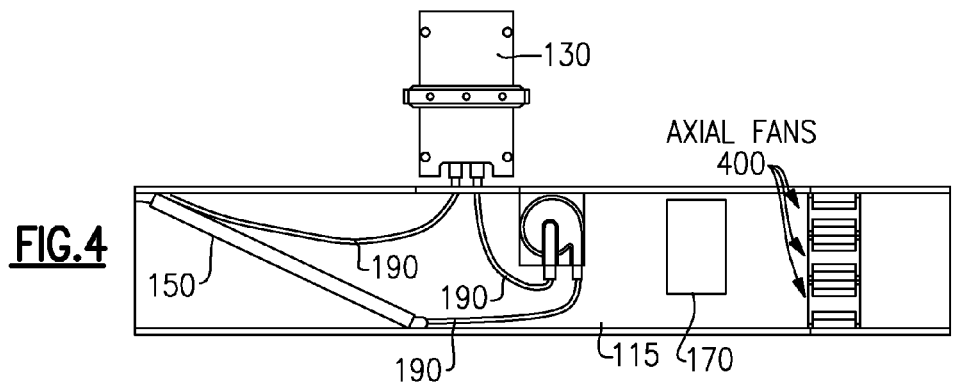
FIGS. 4 and 5 are illustrations of other alternate embodiments of present invention, each having a redundant hybrid cooling system that utilizes multiple air moving devices.

In FIG. 4, yet another alternate embodiment of the present invention is illustrated. The cross sectional illustration of FIG. 4 still reflects the same hybrid module 220 having a cold plate 130 and auxiliary drawer 115. In the cross sectional illustration of FIG. 4, however, in addition to other elements already discussed the single moving device has been replaced by multiple moving devices 400 as illustrated.

In this embodiment, the moving devices 400 are multiple axial fans, such as the kind commonly used in high volume 1U or 2U server package arrangements as known to those skilled in the art. The multiple axial fans 400 are disposed in the auxiliary drawer 115.

As is normal in server equipments, the fans 400 all run at a speed below their maximum speed during normal operation. In the event that one or more of the fans 400 fail, the remaining fans begin to operate at full speed so as to maintain a continuously seamless performance.

Figure 5:
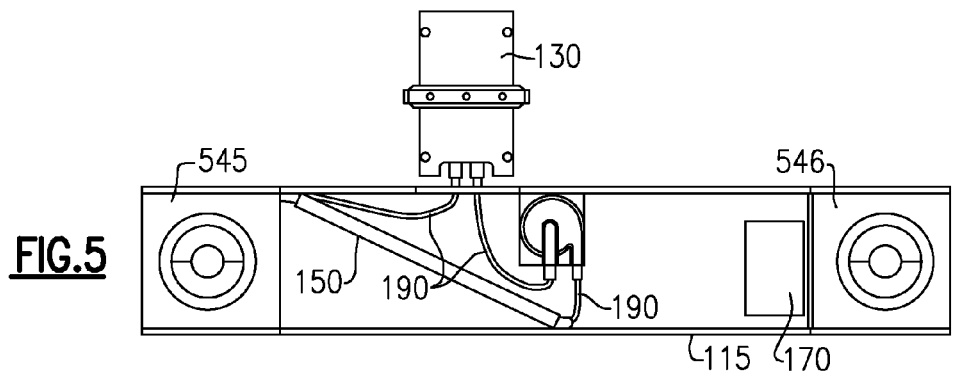

In FIG. 5, an alternative arrangement is illustrated. The cross sectional illustration of FIG. 5 still provides for a plurality of air moving devices, however, in this case the multiple axial fans of the previous embodiment are replaced by a plurality of blowers.

As in previous cases, for ease of understanding only two blowers 545 and 546 are illustrated in FIG. 5 with the understanding that in alternate embodiments, more numerous blowers can be selectively implemented.

In FIG. 5, the two blowers 545 and 546 in one embodiment run at a slow speed during normal operation. In one embodiment, as provided, the blowers 545 and 546 can be disposed in opposing ends of the auxiliary tray as illustrated.

In the event of a blower failure (which may include either total failure or partial failure), the remaining blower or blowers increase their speed. When only one other blower is utilized and there is a full failure of the other blower, the remaining blower will increase its speed up to full speed when appropriate.

In another scenario, only one blower may operate at any given time such that if a blower or a plurality of blowers (where more than two is utilized), the remaining blower or blowers will start to operate.

The redundant systems that were discussed above, each focused on one or more particular areas where failures may occur or greater cooling performance is desired. In FIG. 1, fins where added to one or more cold plates to enhance such performance. In FIGS. 2 and 3, redundant liquid pumps were added both in a parallel and in a series arrangement respectively to provide redundancy. Finally FIGS. 4 and 5 provided a variety of arrangement for some examples of air moving devices. It shall, however, be obvious that while the focus areas were discussed independently, in some embodiments it is possible to combine the redundant systems all together or in any other combination in to create a much improved system. For example it is possible to have a system that includes cold plate fins and a plurality of liquid pumps placed in parallel. Other features may also be combined with one another in different arrangements of the hybrid module as appreciated by those skilled in the art.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

What is claimed is:

1. An electronics apparatus comprising:

an electronics drawer slideably insertable into an electronics rack comprising a plurality of electronics drawers, the electronics drawer being an air-flow cooled electronics drawer comprising a plurality of electronic components and one or more first air-moving devices establishing a primary airflow cooling of the plurality of electronic components within the electronics rack, the plurality of electronic components producing a heat load dissipated via the primary airflow cooling thereof through the electronics drawer;

an auxiliary cooling apparatus facilitating auxiliary cooling of one or more electronic components of the plurality of electronic components of the electronics drawer slideably insertable into the electronics rack, the auxiliary cooling apparatus providing auxiliary cooling to the one or more electronic components of the plurality of electronic components and reducing the heat load of the plurality of electronic components within the electronics drawer dissipated via the primary airflow cooling thereof through the electronics drawer, thereby facilitating primary airflow cooling of one or more other electronic components of the plurality of electronic components of the electronics drawer, comprising:

a separate auxiliary cooling drawer externally physically attached to and disposed external to the electronics drawer slideably insertable into the electronics rack, the separate auxiliary cooling drawer slideably inserting into the electronics rack as a unit with the physically attached electronics drawer, and being physically attached to the electronics drawer along a side surface of the electronics drawer;

at least one liquid-cooled cold plate disposed within the electronics drawer and coupled to the one or more electronic components to be auxiliary cooled within the electronics drawer;

an air-to-liquid heat exchanger disposed within the separate auxiliary cooling drawer externally physically attached to the electronics drawer;

a closed-path coolant loop comprising piping, wherein said piping couples the at least one liquid-cooled cold plate within the electronics drawer and the air-to-liquid heat exchanger within the separate auxiliary cooling drawer in fluid communication, said piping runs between the electronics drawer and the separate auxiliary cooling drawer and extends through the side surface of the electronics drawer;

at least one pump coupled in fluid communication with the closed-path coolant loop for circulating coolant between the at least one liquid-cooled cold plate within the electronics drawer and the air-to-liquid heat exchanger within the separate auxiliary cooling drawer externally physically attached to the electronics drawer, the at least one pump being disposed within the separate auxiliary cooling drawer; and at least one second air-moving device moving air across the air-to-liquid heat exchanger and cooling coolant circulating therethrough, the at least one second air-moving device being disposed within the separate auxiliary cooling drawer externally physically attached to the electronics drawer, wherein heat removed via the at least one liquid-cooled cold plate coupled to the one or more electronic components within the electronics drawer is dissipated in the separate auxiliary cooling drawer to airflow passing across the air-to-liquid heat exchanger disposed therein, thereby reducing the heat load within the electronics drawer dissipated by the primary airflow cooling through the electronics drawer.

2. The electronics apparatus of claim 1, wherein the separate auxiliary cooling drawer has a drawer height and a drawer depth equal to a drawer height and a drawer depth, respectively, of the electronics drawer comprising the one or more electronic components to be auxiliary cooled, and to which the separate auxiliary cooling drawer is externally attached along the side surface thereof and wherein the side surface of the electronics drawer extends for a distance equal to the drawer depth.

3. The electronics apparatus of claim 2, wherein the separate auxiliary cooling drawer further comprises a drawer width which is less than a drawer width of the electronics drawer comprising the one or more electronic components to be cooled and to which the separate auxiliary cooling drawer is externally attached along the side surface thereof.

4. The electronics apparatus of claim 1, wherein the separate auxiliary cooling drawer is a dedicated auxiliary cooling drawer facilitating auxiliary cooling of the one or more electronic components of only the electronics drawer to which the separate auxiliary cooling drawer is externally physically attached along the side surface thereof.

5. The electronics apparatus of claim 1, wherein airflow through the airflow cooled electronics drawer of the electronics rack is from an air inlet side to an air outlet side thereof, and wherein airflow through the separate auxiliary cooling drawer externally attached along the side surface of the electronics drawer is parallel to the airflow through the electronics drawer.

6. The electronics apparatus of claim 1, further comprising a plurality of parallel-extending, air-cooled fins coupled to each liquid-cooled cold plate to provide backup cooling in place of or simultaneous with cooling provided via the liquid-cooled cold plate.

7. The electronics apparatus of claim 1, further comprising a first liquid pump and a second liquid pump connected in parallel in fluid communication with the closed-path coolant loop, the first liquid pump and the second liquid pump each having a respective check valve associated therewith to ensure continued operation of that pump should the other pump fail, wherein the first liquid pump and the second liquid pump are disposed within the separate auxiliary cooling drawer that is externally attached to the electronics drawer along the side surface thereof.

8. The electronics apparatus of claim 1, further comprising a first liquid pump and a second liquid pump coupled in series within the closed-path coolant loop, and wherein the cooling apparatus further comprises a controller to operate the first liquid pump and the second liquid pump at an optimal level, below a maximum capacity level when both the first liquid pump and the second liquid pump are operational, wherein the first liquid pump and the second liquid pump are disposed within the separate auxiliary cooling drawer that is externally attached to the electronics drawer along the side surface thereof.

9. The electronics apparatus of claim 1, further comprising the electronics rack and the plurality of electronics drawers, each electronics drawer of the plurality of electronics drawers being an airflow-cooled electronics drawer and being slideably inserted in the electronics rack, and wherein the auxiliary cooling apparatus further comprises a plurality of separate auxiliary cooling drawers, each separate auxiliary cooling drawer being externally physically attached to a respective electronics drawer of the plurality of electronics drawers along a side surface thereof and slideably inserting into the electronics rack with the physically attached electronics drawer.

10. The electronics apparatus of claim 9, wherein the auxiliary cooling apparatus further comprises at least one liquid-cool cold plate disposed within each electronics drawer and coupled to one or more electronic components to be cooled within the electronics drawer, and wherein each separate auxiliary cooling drawer externally attached to its respective electronics drawer along a side surface thereof comprises a respective air-to-liquid heat exchanger, at least a portion of a closed-path coolant loop coupling the at least one liquid-cool cold plate within the respective electronics drawer and the air-to-liquid heat exchange within the separate auxiliary cooling drawing in fluid communication, at least one respective pump coupled in fluid communication with the closed-path coolant loop for circulating coolant between the at least one liquid-cool cold plate within the respective electronics drawer and the at least one air-to-liquid heat exchanger within the separate auxiliary cooling drawer externally attached to the side surface thereof, and at least one respective air-moving device for moving air across the air-to-liquid heat exchanger for cooling coolant circulated therethrough.

* * * * *